United States Patent [19]

Dulcey et al.

[11] Patent Number: 5,648,201
[45] Date of Patent: Jul. 15, 1997

[54] EFFICIENT CHEMISTRY FOR SELECTIVE MODIFICATION AND METALLIZATION OF SUBSTRATES

[75] Inventors: Charles S. Dulcey, Washington, D.C.; Timothy S. Koloski; Walter J. Dressick, both of Ft. Washington, Md.; Jeffrey M. Calvert, Alexandria; Brian M. Peek, Annandale, both of Va.

[73] Assignee: The United Sates of America as represented by the Secretary of the Navy, Washington, D.C.

[21] Appl. No.: 991,680

[22] Filed: Dec. 16, 1992

Related U.S. Application Data

[63] Continuation-in-part of Ser. No. 691,565, May 25, 1991, abandoned, and a continuation-in-part of Ser. No. 933,147, Aug. 21, 1992, Pat. No. 5,334,696.

[51] Int. Cl.$^6$ .............................. G03C 5/00; G03C 1/492; B05D 3/04; B05D 1/18
[52] U.S. Cl. .................. 430/324; 430/270.1; 430/296; 430/311; 430/315; 430/967; 427/98; 427/304; 427/305; 427/437
[58] Field of Search ..................... 430/424, 324, 430/270, 315, 296, 311, 967, 270.1; 427/304, 98, 305, 437

[56] References Cited

U.S. PATENT DOCUMENTS

| | | | |
|---|---|---|---|
| 3,900,320 | 8/1975 | Rolker et al. | 430/324 |
| 4,330,569 | 5/1982 | Gulett et al. | 195/806 |
| 4,344,981 | 8/1982 | Imada et al. | 158/407 |
| 4,487,880 | 12/1984 | Ueno et al. | 543/891 |
| 4,521,444 | 6/1985 | Ponjee et al. | 427/41 |
| 4,746,536 | 5/1988 | Ichikawa et al. | 427/54.1 |
| 4,925,701 | 5/1990 | Jansen et al. | 199/646 |
| 4,957,591 | 9/1990 | Sato et al. | 281/650 |
| 5,063,081 | 11/1991 | Cozzette et al. | 567/870 |
| 5,079,600 | 1/1992 | Schnur et al. | 357/4 |
| 5,137,784 | 8/1992 | Suzuki et al. | 490/418 |
| 5,156,918 | 10/1992 | Marks et al. | 428/447 |
| 5,270,080 | 12/1993 | Mino et al. | 831/51 |
| 5,389,496 | 2/1995 | Calvert et al. | 430/315 |

FOREIGN PATENT DOCUMENTS

| | | |
|---|---|---|
| 110258 | 6/1984 | European Pat. Off. . |
| 225548 | 7/1985 | United Kingdom . |

OTHER PUBLICATIONS

"Deep UV Photochemistry of Chemisorbed Monolayers: Patterned Coplanar Molecular Assemblies", Dulcey et al., *Science*, 26 Apr. 1991.

Calvert et al., "New Surface Imaging Techniques for Sub-0.5 Micrometer Optical Lithography", Solid State Technology 34, (10) 77 (Oct. 1991).

*Primary Examiner*—George F. Lesmes
*Assistant Examiner*—Bernard P. Codd
*Attorney, Agent, or Firm*—Thomas McDonnell; John Karasek

[57] ABSTRACT

A process for efficient modification and metallization of substrates includes the steps of providing a substrate with highly photoefficient chemical functional groups on at least a portion of this substrate, exposing the substrate to actinic radiation to transform, deactivate, or remove these chemical functional groups, to modify their chemical reactivity, and carrying out further chemical reaction steps on these modified chemical functional groups.

7 Claims, 1 Drawing Sheet

EFFICIENT CHEMISTRY FOR SELECTIVE MODIFICATION AND METALLIZATION OF SUBSTRATES

CROSS REFERENCE TO RELATED APPLICATION

This is a continuation in part of prior applications Ser. No. 07/691,565, filed May 25, 1991 by Calvert et al., now abandoned, and Ser No. 07/933,147, filed Aug. 21, 1992 now U.S. Pat. No. 5,334,696 by Calvert et al., which are incorporated by reference herein.

BACKGROUND OF THE INVENTION

1. Field of the Invention

The present invention relates to methods and materials for high speed radiation-induced functionalizing of substrates, and more particularly to methods and materials for functionalizing substrates by selectively transforming surface-bound chemisorbed functional groups with high photospeeds. This transformation is accomplished by exposing the functionalized substrates to actinic radiation and then further reacting the substrates by carrying out substitution (grafting) reactions to impart a desired characteristic to the substrate.

2. Description of the Related Art

Selectively modified substrates are useful in a variety of applications, including microelectronics, lithography, optics, and medical technology. Of particular interest is the selective modification of substrates such as silicon, silica, plastics, metals, metal oxides, and ceramics. In particular, selective deposition of adherent, conductive metal coatings on these substrates is of great technological interest for high resolution integrated circuit fabrication and printed circuit applications. The use of patterned irradiation in selectively modifying these substrates is a useful technique, due to the ability of this technique to spatially control modification placement, and due to the high resolution that can be achieved.

Typically in these processes, a substrate is modified by the attachment of chemical functional groups. The chemically modified surface is then exposed to patterned actinic radiation, such as through a mask, thereby altering the chemical nature of selected areas on the surface. In this context, actinic radiation is any radiation that can effect the desired change in the chemical nature of the surface, such as visible or ultraviolet light, x-rays, $\gamma$-rays, ions, electron beams, etc.

Typically, after the surface has been irradiated, further processing steps are employed, depending on the particular application at hand. For example, in metallization applications the attached chemical functional groups are ligands and these ligands are deactivated or transformed by actinic radiation. Ligands are defined herein to be chemical moieties capable of complexing with catalysts for electroless metallization. After irradiation these surfaces are catalyzed, then selectively metallized by immersion in an electroless metallization plating bath. See, e.g.. U.S. patent application Ser. No. 07/933,147, filed Aug. 21, 1992 by Calvert, Pehrsson and Peckerar, which is incorporated by reference herein. See also co-pending application Ser. No. 07/691,565.

A problem with many of these processes is that typically the exposure step has a very low irradiative efficiency, or photospeed. In this context, photospeed is inversely related to the amount, i.e. fluence, of actinic radiation (typically measured in $mJ/cm^2$ for photons, ions/$cm^2$ for ions, or $\mu A/cm^2$ for electrons) required to effect the necessary change in the chemical nature of the surface. For example, when pyridyl groups in films of 2-(trimethoxysilyl)ethyl-2-pyridine are attached to an $SiO_2$ substrate, the irradiative conversion of these groups to a non-binding photo-product requires about 1500 $mJ/cm^2$ of deep UV (193 nm) radiation. The drawbacks to such low photospeeds include longer exposure times, larger energy requirements, and decreased likelihood of the photoreaction resulting in the desired photoproducts.

SUMMARY OF THE INVENTION

Accordingly, it is an object of this invention to improve the irradiative efficiency of these processes, while maintaining or improving their generality.

These and additional objects of the invention are accomplished by the structures and processes hereinafter described.

The method of the present invention comprises attaching chemical functional groups with high photospeeds to a substrate, where the photoproducts of these groups have different reactivities, where these chemical functional groups or their photoproducts are amenable to further grafting reactions, then exposing the substrate to actinic radiation (which may be patterned or unpatterned), and contacting the substrate with a substitution (grafting) reagent, to modify the chemical nature of the substrate surface.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein.

DESCRIPTION OF THE PREFERRED EMBODIMENTS

Figure 1:
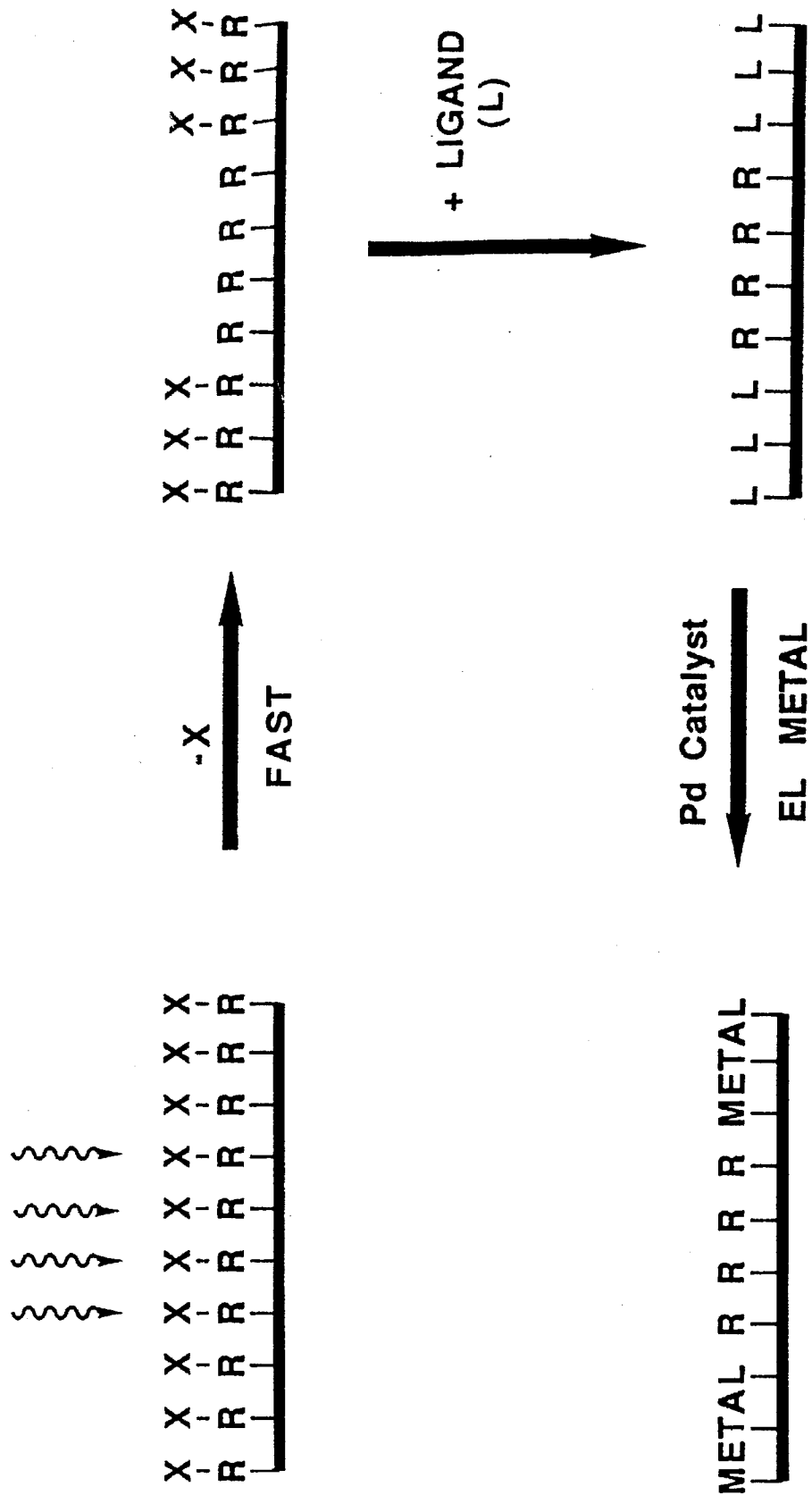
FIG. 1 illustrates the process steps for selectively depositing a metal film on a surface.

The process of this invention may be applied to a broad range of substrates, including silicon, silica, plastics, metals, metal oxides, and ceramics.

The process of this invention may be used to efficiently pattern a substrate. For example, a substrate may be selectively metallized using this process, by using patterned actinic radiation to define the pattern in the exposure step. The terms "pattern" and "patterning" have meanings that vary from application to application. However, for each area of application, these terms are well-understood by skilled practitioners in the art. For example, in the context of fabricating circuit boards, patterned metallization means laying down conductive pathways on a circuit board, preferably with through-holes and other useful structures. In the context of microelectronic applications, patterned metallization means laying down conductive pathways with linewidths in the sub-0.5 µm range, consistent with VLSI applications. Preferably, in the context of microelectronics, these linewidths are about 0.1 µm, using currently available lithographic techniques. As x-ray lithographic techniques improve, it is anticipated that the present invention will produce microelectronic circuits with linewidths of about 0.05 µm. In the context of lithography, patterning means creating a pattern of lines on a mask with sufficient resolution and packing density for the particular application at hand. In the context of chemical applications (such as chemical sensing) patterned chemical modification means attaching chemical groups in a pattern consistent with the specific application and system at hand.

The process of this invention may also be used to control the magnitude of a given property on the substrate surface. In this embodiment of the invention, the amount of actinic radiation that the surface is exposed to is controlled, so that the fraction of surface-bound chemical functional groups converted to their photoproducts is likewise controlled. Consequently the degree to which the chemical nature of the substrate is modified by the grafting reaction is likewise controlled.

For example, surface wettability can be controlled using this invention by attaching the chemical functional groups, exposing the substrate to an amount of actinic radiation to convert a fraction of these chemical functional groups to their photoproducts, and then contacting the substrate with a grafting reagent having a moiety of known hydrophobic or hydrophilic character, thereby controlling the wettability of the substrate surface.

Likewise in metallization applications, the dose of actinic radiation can control the degree of metal nucleation density on the surface. This control can be useful in a variety of optical applications, such as making graded neutral density filters and beamsplitters.

Mixed films of arbitrary percentages of an arbitrary number of species can also be readily made using this process. A series of controlled exposure steps interposed with a series of steps to graft on different functionalities can be used to create mixed films with precise compositional control of homogeneously or isotropically distributed species and films with precisely graded physical and chemical properties.

In a preferred embodiment of the invention, the attached chemical functional groups contain an activated moiety, which will require at most about 100 mJ/cm$^2$ to convert to its photoproduct.

In a preferred embodiment of the invention, the attached chemical functional groups contain an organic halide or pseudohalide moiety. The terms "pseudohalide" and "pseudohalogen" are well understood in the chemical art. Pseudohalides, like halides, act as good leaving groups, and are represented in reactions as X$^-$. Examples of pseudohalides are acetate (OAc), trifluoromethanesulfonate or triflate (OTf), methanesulfonate, toluenesulfonate, sulfonate, rosylate, azide, cyanide, isocyanide, thiocyanate, isothiocyanate, and thiosulfate. These organic halides and pseudohalides undergo nucleophilic attack. Their photoproducts, however, will have chemical reactivities that are very different from these organic halides and organic pseudohalides. Nucleophilic reagents are preferably used as the grafting reagents when these chemical functional groups are attached to the substrate. Reactions of organic halides or pseudohalides with nucleophilic grafting reagents are of the form: SUB-RX+:N-L→SUB-R-N-L+X$^-$, where SUB is the substrate to be modified, RX is the organic halide or organic pseudohalide functional group, and :N-L is the nucleophilic reagent with the included functionality (which may be a ligating moiety or some other functionality).

In a preferred embodiment, the grafting reaction is a Gisin reaction, which uses a cesium salt of a carboxylic acid to graft a functionality onto a halide-containing reactant on a substrate by forming an ester bond. These reactions are of the form SUB-RX+R'COO$^-$.Cs$^+$→R'COO-R-SUB+CsX. A more complete description of these reactions may be found in Wang et al., "Facile Synthesis of Amino Acid and Peptide Esters under Mild Conditions via Cesium Salts", J. Organic Chemistry 42 (8) pp. 1286–90 (1977), which is incorporated by reference herein.

Most preferably, the grafting reaction uses a lithium salt of an amine to graft a functionality onto a halide-containing reactant on a substrate by forming a secondary amine bond. These reactions are of the form SUB-RX+R'NH$^-$Li$^+$→R'NH-R-SUB+LiX.

Preferably, the organic halide or organic pseudohalide moiety is a benzyl halide or benzyl pseudohalide moiety having the general formula:

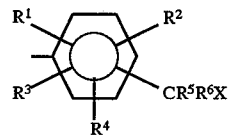

where X is a halide or pseudohalide and the groups R$^1$ through R$^6$ are independently selected from functional groups such as hydrogen, halide, substituted and unsubstituted alkyl, substituted and unsubstituted alkenyl, substituted and unsubstituted alkynyl, substituted and unsubstituted aryl, substituted and unsubstituted heterocycle, substituted and unsubstituted amine, substituted and unsubstituted thiol, substituted and unsubstituted alcohol, substituted and unsubstituted ether, and substituted and unsubstituted ester. An adjoining pair of the groups R$^1$, R$^2$, R$^3$, and R$^4$ may form part of a cyclic group. Preferably, all the groups R$^1$ through R$^6$ are hydrogens. Preferably the benzylic carbon is in the para position, relative to the bond with the rest of the attached chemical functional group. These benzyl halides and benzyl pseudohalides have excellent photospeeds: irradiative eliminations of halogens or pseudohalogens from these species result in the efficient loss of halogens or pseudohalogens from the species, requiring only about 50 mJ/cm$^2$ of deep UV (193 nm) radiation for the formation of the photoproducts.

Alternatively, these attached chemical functional groups contain a diazonapthoquinone (DNQ) moiety, with the general formula:

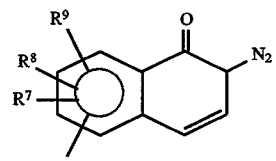

The groups R$^7$ through R$^9$ may be independently selected from functional groups such as hydrogen, halide, substituted and unsubstituted alkyl, substituted and unsubstituted alkenyl, substituted and unsubstituted alkynyl, substituted and unsubstituted aryl, substituted and unsubstituted alkoxy, substituted and unsubstituted amine, and substituted and unsubstituted thiol. An adjoining pair of the groups R$^7$ through R$^9$ groups may form part of a cyclic group. Preferably, all the groups R$^7$ through R$^9$ are hydrogens. Upon exposure to actinic radiation, the DNQ moiety undergoes a Wolff rearrangement to form an indene carboxylic acid:

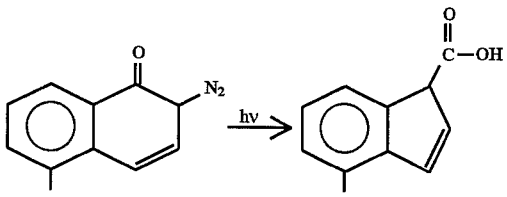

This indene carboxylic acid photoproduct is amenable to grafting at the carboxylic carbon. This provides a means for attaching functionalities using all of the known reactions of carboxylic acids. Nucleophilic reagents are also preferably used as the grafting reagents when these chemical functional groups are attached to the substrate. In this embodiment of the invention, the portions of the substrate that undergo grafting are those portions that are exposed to actinic radiation to form the photoproduct. In contrast, in the embodiment of the invention where the attached chemical functional groups contain an organic halide or organic pseudohalide moiety, the portions of the substrate that undergo grafting are those portions of the substrate that are not exposed to actinic radiation to form the photoproduct.

This Wolff rearrangement reaction is known to provide an efficient means for converting a DNQ moiety to a carboxylic acid moiety. In the present invention, reactions of indene carboxylic acids on the substrate with nucleophilic reagents may be of the form SUB-RCOOH+:N-L→SUB-RCON-L+OH$^-$, where SUB is the substrate to be modified, RCOOH is the indene carboxylic acid, and :N-L is the nucleophilic reagent with the included functionality.

Nucleophilic reagents will be the preferred substitution reagents where the surface-bound chemical functional groups contain an organic halide or pseudohalide, or a DNQ moiety, or any other moiety where either the moiety or its photoproduct is subject to nucleophilic attack. The nucleophilic reagent may be any of the common nucleophilic reagents, including cyanides, amines, phosphines, alkoxides, carboxylates, thiolates, acetylides, and carbanions. These nucleophilic reagents will include some functionality (designated L above) that is desired on the substrate surface. Thus, when the nucleophilic reagent is reacted with the modified substrate, this functionality is grafted onto the surface.

This grafting technique may be applied generally to attach functional groups with any desired characteristic onto a surface. For example, reaction of SUB-RX with :N-C or :N-F, where C and F are a chromophore or fluorophore, respectively, provides a general method for preparing homogenous or patterned surfaces of chromophores or fluorophores.

Alternatively, a nucleophilic reagent :N-A could possess a functional group, A, that is known to promote or inhibit adhesion of various materials. For example, sulfonate and sulfonic acid surfaces are known to minimize non-specific protein adsorption. It would be inefficient to form these groups on surfaces by photooxidizing thiol-terminated surfaces, because this process requires ≈2 J/cm$^2$ at 193 nm to carry out. See S. K. Bhatia et al., "Fabrication of Surfaces Resistant to Protein Adsorption and Their Application to Two Dimensional Protein Patterning", *Analytical Biochemistry* 208 (1993) (in press), which is incorporated by reference herein. Reaction of a patterned benzyl halide surface with a reagent such as :N-SO$_3^-$ or :N-S%H produces sulfonated surfaces with similar resistance to non-specific protein adsorption in selected regions, but with highly photoefficient patterning.

The process of the invention is not limited to the use of nucleophilic substitution reagents, however. Some surface-bound chemical functional groups will be amenable to electrophilic attack, while their photoproducts will not. Likewise, some surface-bound chemical functional groups will not be amenable to electrophilic attack, while their photoproducts will. In both of these cases, an electrophilic reagent of the form E-L will be the preferred grafting reagent.

In a preferred embodiment of the invention, chemical functional groups are attached to the substrate by either (1) chemisorbing onto the substrate chemical functional groups capable of bonding to the substrate, or (2) oxidizing the substrate in an RF oxygen plasma and chemisorbing onto the oxidized substrate chemical functional groups capable of bonding to the oxidized surface. Preferably, these chemical functional groups are attached to the substrate with organosilane linkages.

A particularly preferred embodiment of this invention is high photospeed patterning and selective metallization of surfaces. As shown in FIG. 1, in a particular embodiment of the invention, the surface to be metallized is first homogeneously modified with chemisorbed functional groups containing organic halide or pseudohalide moieties which are non-ligating towards an electroless metallization catalyst. Preferably, these organic halide or pseudohalide moieties are benzyl halides or pseudohalides. The modified surface is exposed to patterned actinic radiation. The irradiated surface is then contacted with a nucleophilic reagent having a ligating moiety, where this ligating moiety is catalyzable for electroless metallization. Ligating moieties are defined herein to be moieties that are catalyzable for electroless metallization. The ligated surface is then contacted with a catalyst for electroless metallization. Preferably, this catalyst is a Pd-based catalyst. Most preferably, this catalyst is an essentially Sn-free Pd-based catalyst. The catalyzed surface is immersed in an electroless metallization plating bath, to deposit the metal film on the surface. A wide variety of electroless metallization plating baths are commercially available. Substrates can be metallized according to this invention with one or more metal or alloy such as copper, nickel-boron, nickel-phosphorus, cobalt-boron, cobalt-phosphorus, gold, palladium, iron, rhenium, and permalloy.

In all embodiments of the present invention where the surface is patterned, the attached chemical functional groups are removed, damaged, transformed, rearranged, or otherwise chemically altered by exposure to patterned actinic radiation. The actinic radiation used in this invention preferably is from photon, electron, or ion sources. Preferred sources of actinic radiation include UV contact and projection printing systems (such as g- or i-line mercury lamp sources), KrF lasers, ArF lasers, F$_2$ lasers, x-ray proximity and projection exposure tools, e-beam writing systems (such as scanning electron microscopes and scanning tunnelling microprobes), and focused ion beam exposure tools.

In the metallization embodiments of the present invention, the functionalized, irradiated surface is reacted with a substitution reagent having a ligating moiety, where this ligating moiety is amenable to binding to catalysts for electroless metallization. The ligated substrate is then contacted with an electroless plating catalyst. Skilled practitioners in the art will recognize that a large variety of complexation reactions (reactions between catalysts and catalyzable functional groups) may be selected from. See generally A. Martell et al. "Critical Stability Constants", Plenum Press, New York (1975) (tabulating complexation reactions), incorporated by reference herein. Preferred catalyzable grafting reagents include 4,4'-bipyridine, 1,2-bis (pyridyl)ethane, 4-aminopyridine, 4-mercaptopyridine, 1,2-bis(diphenylphosphino)ethane, 3-lithiopyridine, N-lithiodiaminoethane, cesium nicotinate, and cesium isonicotinate. The catalysts for electroless metallization are preferably palladium catalysts. Most preferably, these catalysts are essentially tin-free palladium catalysts. After catalyzation, the substrate is then immersed in an electroless plating bath to effect the metallization.

Having described the invention, the following examples are given to illustrate specific applications of the invention, including the best mode now known to perform the invention. These specific examples are not intended to limit the scope of the invention described in this application.

EXAMPLES

Example 1

Surface functionalization with 4-chloromethylphenyltrichlorosilane

A silicon native oxide wafer was cleaned by immersion in a 1:1 solution of HCl/methanol for 30 min, rinsed with DI water, and then immersed in concentrated sulfuric acid for 30 min, rinsed three times with water, then dried under a stream of flowing $N_2$. A fused silica slide and a silicon wafer with a 350 Å thick thermally grown oxide were cleaned using the same procedure. The substrates were then treated with a 1% (v/v) solution of 4-chloromethylphenyltrichlorosilane (Huls America, Piscataway, N.J.), UTF-24, in toluene at room temperature under an argon atmosphere for 5–7 min. The substrates were removed from the solution, rinsed twice in fresh toluene, and then baked for 5 min. at 120° C. on the surface of a hotplate. The water contact angle of the UTF-24 treated surfaces typically ranged between 65°–70°. The UV absorption spectrum of a treated fused silica slide exhibited absorption maxima at 198 and 224 nm, characteristic of the benzyl chloride chromophore. For a discussion of the UV spectra of simple substituted aromatic chromophores, see the manuscript by: D. L. Doub and J. M. Vandenbelt, *Journal of the American Chemical Society*, 99, 2714 (1947). X-ray photoelectron spectroscopy (XPS) analysis of the UTF-24 treated silicon native oxide wafer showed peaks indicative of chlorine between binding energies of ≈198–202 eV. This example demonstrates that the benzyl chloride functional group can be attached to the surfaces of various substrates.

Example 2

Preparation of 4-iodomethylphenyltrimethoxysilane

A solution of 1.7 grams of 4-chloromethylphenyltrimethoxysilane, UTF-24M, in 60 mL of dry acetone was stirred with 1.7 g of NaI and heated at reflux under an argon atmosphere for 5 h. The reaction was performed under yellow Safelight conditions. Acetone was removed under vacuum, and the product was extracted with toluene. The resulting colorless to light yellow liquid was stored as a 0.067M stock solution in toluene. The iodinated silane will be referred to as UTF-24I. A $^1$H NMR spectrum of UTF-24I in $C_6D_6$ exhibited resonances at δ=7.61 (doublet) and 7.02 (doublet) for the aromatic ring protons, δ=3.86 for the benzylic protons, and δ=3.43 for the methoxy protons. These values are in comparison to the $^1$HNMR spectrum for the chloro (UTF-24M) starting material, which gave resonances at δ=7.68 (doublet), 7.08 (doublet), 4.03 and 3.45. The upfield shift of the benzylic protons is consistent with replacement of chlorine by the less electronegative iodine atom. See the monograph by: E. D. Becker, "High Resolution NMR", Academic Press, New York, pg. 73 (1969). This example demonstrates that a benzyl iodide containing silane can be prepared in solution.

Example 3

Surface functionalization with 4-iodomethylphenyltrimethoxysilane

Silicon native oxide wafers, thermal oxide wafers, and fused silica slide were cleaned as in Example 1. The stock solution of UTF-24I, as described in Example 2, was diluted 1:10 in toluene. The cleaned substrates were immersed in the diluted UTF-24I solution and the solution was heated from room temperature to 50° C. over 1 h. The substrates were removed from the solution, rinsed twice in fresh toluene, and baked for 5 min at 120° C. on the surface of a hotplate.

The water contact angle of the UTF-24I treated substrates ranged from 60°–65°. The treated fused silica slide exhibits a UV absorption spectrum with a maximum at ≈195 nm and shoulders at ≈235 nm and ≈280 nm. XPS analysis of the UTF-24I modified Si native oxide surface shows the characteristic doublet signal for I centered at a binding energy of ≈625 eV. This example demonstrates that the benzyl iodide functional group can be attached to the surfaces of various substrates.

Example 4

Conversion of a benzyl chloride functionalized surface to a benzyl iodide surface Substrates functionalized with UTF-24, as described in Example 1, were immersed in a 0.1M solution of NaI in acetone for 40 h at 40° C. The substrates were removed from the acetone solution, rinsed with water three times, and dried under $N_2$. The UV spectrum, water contact angle, and XPS analysis of these substrates gave similar results to those obtained for the 24I treated surface in Example 3. The clear shifts in the UV spectrum compared to the UTF-24 spectrum obtained in Example 1 indicate that a surface reaction occurred. The observation of a signal for iodine, and the lack of a signal for Cl in the XPS indicated that complete conversion of UTF-24 to UTF-24I had taken place. This example illustrates the use of a surface exchange reaction as a method for in situ preparation of benzyl halide UTFs.

Example 5

Formation and surface deposition of (p-trimethoxysilylbenzyl)acetate

Silicon native oxide wafers, thermal oxide wafers, and fused silica slides were cleaned as in Example 1. The stock solution of UTF-24I, described in Example 2, was diluted 1:10 by volume in toluene containing $1\times10^{-3}$M acetic acid to replace the iodine with acetate. The clean substrates were immersed in the diluted solution and the solution was heated from room temperature to 50° C. over a period of 1 h. The substrates were removed from the treatment solution and rinsed twice with fresh toluene, then baked for 5 min at 120° C. on a hotplate.

The fused silica slides that were treated with the (p-trimethoxysilylbenzyl)acetate (UTF-24A; acetate group is abbreviated hereafter as OAc) films exhibited a UV absorption spectrum with a maximum at 195 nm and shoulders at 225 nm and 265 nm.

Example 6

Conversion of iodide to triflate in surface films of UTF-24I

A silicon thermal oxide wafer and a fused silica slide with approximate monolayer coverages of UTF-24I (see Example 4) were treated with a 0.03M toluene solution of silver trifluoromethanesulfonate (AgCF$_3$SO$_3$; the trifluoromethanesulfonate group is referred to hereafter as "triflate", and abbreviated as OTf). The conversion of UTF-24I to a film based on (p-trimethoxysilylbenzyl)triflate (UTF-24T) was complete within 42 h at 25° C., as determined by UV spectroscopy. Substrates were removed from the treatment solution and rinsed three times with water.

The UV absorption spectrum of the UTF-24T treated fused silica slide exhibited a maximum at 195 nm and shoulders at 220 nm and 240 nm.

Example 7

Conversion of non-ligating surfaces to surfaces having an ethylenediamine ligand N-Lithiodiaminoethane (Li-EDA) was prepared by the dropwise addition of 61 g of distilled ethylenediamine to a suspension of 6.94 g of Li powder in 250 mL of dry, degassed benzene. The mixture was heated at reflux under Ar for 1.5 h and allowed to cool to room temperature. The precipitate was filtered under Ar and rinsed 3 times with 200 mL of dry, degassed hexane. The solid was further dried under vacuum for 1 h. The procedure used here was as described in the manuscript by O. F. Beumel and R. F. Harris, *Journal of Organic Chemistry*, 28, 2775 (1963).

Substrates treated with UTFs having halobenzyl or pseudohalobenzyl groups (UTF-24, 24I, 24A and 24T) were immersed in 3×10$^{-3}$M solution of the lithium salt of ethylenediamine (Li-EDA) in HPLC grade dimethylformamide (DMF). Treatment times were: 15 min for UTF-24I and UTF-24A, 20 min for UTF-24T, and 90 min for UTF-24. Substrates were removed from the treatment solution, rinsed with CH$_3$CN, and then rinsed repeatedly with water.

The resulting UV absorption spectra, measured for the product of the LI-EDA grafting reaction on the various UTF-treated surfaces, were essentially identical and exhibited a maximum absorbance at ≈195 nm and a shoulder at 220 nm. This result indicates that the various halide, or pseudohalide groups (i.e., Cl, I, OTf, OAc) were replaced by the EDA functional group to give a common product. The water contact angle for the grafted EDA surface was ≈50°.

Example 8

Conversion of a non-ligating UTF-24I surface to a surface having a bis(diphenylphosphino)ethane ligand A Si thermal oxide wafer and a fused silica slide having UTF-24I surfaces were treated with an 1.25×10$^{-3}$ solution bis(diphenylphosphino)ethane (diphos) in CH$_3$CN for 24 h. The substrates were rinsed with toluene, and dried. The water contact angle of the diphos-treated surfaces was ≈60°. The UV absorption spectrum of the fused silica slide gave a maximum at ≈195 nm, with shoulders at 225 nm and 270 nm.

Example 9

Conversion of non-ligating UTF-24I surface to surfaces having a 4,4'-bipyridyl ligand A Si thermal oxide wafer and a fused silica slide having UTF-24I surfaces were treated with an 6×10$^{-3}$M solution 4,4'-bipyridine (bpy) in CH$_3$CN at 20° C. for 22 h. The substrates were rinsed with toluene, and dried. The water contact angle of the bpy-treated surfaces was ≈60°. The UV absorption spectrum of the fused silica slide gave a maximum at 195 nm, with a shoulder at 220 nm, and a less intense, broad absorbance from 250–350 nm.

Example 10

Conversion of UTF-24 to a ligating film using cesium nicotinate

A solution of cesium nicotinate was prepared by dissolving 0.11 g of Cs$_2$CO$_3$ and 0.17 g of nicotinic acid in 250 mL of DMF using a flask fitted with a CaSO$_4$ drying tube. The solution was heated and stirred for 4 h at ≈50° C. until all solids were dissolved. A fused silica slide, having a film of UTF-24 as described in Example 1, was immersed in the solution of cesium nicotinate for ≈14 h at 50° C. The slide was removed, rinsed with methanol, and dried under N$_2$. The UV spectrum of the treated slide showed absorptions at ≈260 nm, characteristic of the pyridyl chromophore. This example illustrates that alkylation (Gisin reaction) can be used to convert a non-ligating to a ligating film.

Example 11

Conversion of UTF-24I to a ligating film using 3-lithiopyridine

3-Lithiopyridine (3-Lipy) was prepared as in the manuscript by W. E. Parham and R. M. Piccirilli, *J. Org. Chem.*, 42,257 (1977). To a solution containing 2.1 g of 3-bromopyridine in tetrahydrofuran was added 5.3 mL of a 2.5M solution of n-butyllithium in hexanes. The originally colorless solution became dark red in color. The solution was maintained at −78° C. during the addition of the lithium reagent and for 1 h after addition was complete. The volatiles were removed and the reaction mixture was taken to dryness under vacuum. The product, 3-Lipy, was used without further purification.

A silicon native oxide wafer and a fused silica slide, functionalized with UTF-24I as described in Example 4, were treated with a 3×10$^{-3}$M solution of 3-Lipy in CH$_3$CN for 30 min, then rinsed with fresh CH$_3$CN, and finally rinsed repeatedly with water. The UV spectrum of the fused silica slide exhibited a peak maximum at ≈195 nm, and shoulders at 220 nm and 265 nm. This spectrum is characteristic of a surface-attached pyridyl chromophore. This example demonstrates that lithium reagents can be used to convert non-ligating to ligating surfaces.

Example 12

Deep UV photochemistry of a UTF-24 surface

A fused silica slide, treated with UTF-24 as in Example 1, was exposed to increasing amounts of 193 nm radiation from an ArF excimer laser. The UV spectrum of the slide showed a decrease in intensity of the peaks attributed to UTF-24. However, at doses of ≈70–100 mJ/cm$^2$, a concomitant increase in UV absorption of a band centered at 240 nm was observed. At higher doses, the entire spectrum decreased in intensity. Laser desorption Fourier transform mass spectrometry (LD-FTMS) of the UTF-24 film indicates HCl as the desorbed product of 193 nm irradiation. XPS analysis of the UTF-24 surface exposed to ≈100 mJ/cm$^2$ of 193 nm radiation showed essentially complete removal of Cl from the film. These data are consistent with a photochemical process in which elimination of HCl from the benzyl chloride film occurs at doses of ≈100 mJ/cm$^2$ or less. This example illustrates a photochemical process in which a rapid transformation of a halogen containing film to a non-halogen containing film occurs with a dose below about 100 mJ/cm$^2$.

Example 13

Deep UV photochemistry of a UTF-24I surface

A fused silica slide, treated with UTF-24I as in Example 3, was exposed to increasing amounts of 193 nm radiation from an ArF excimer laser. Similar UV spectral changes were observed for these films as described in Example 12 for UTF-24. Laser desorption Fourier transform mass spectrometry of the UTF-24I film indicates loss of iodine as the primary product of 193 nm irradiation. XPS analysis of the UTF-24I surface exposed to ≈100 mJ/cm$^2$ of 193 nm radiation showed essentially complete removal of I from the film. These data are consistent with a photochemical process in which elimination of I from the benzyl iodide film occurs at doses of ≈100 mJ/cm$^2$ or less. This example illustrates the generality of fast photochemical processes in UTF layers containing benzyl halide functional groups.

Example 14

Homogeneous EL metallization of a pyridyl ligand surface using Cs grafting chemistry A substantially Sn-free Pd catalyst (designated PD1), previously described in U.S. patent application Ser. No. 07/691,565, was of the following composition: 10.3 mg/L Na$_2$PdCl$_4$, 0.11M NaCl, 9×10$^{-3}$M MES buffer, pH=5.7. The pyridine-based ligating film produced in Example 10 was treated with the catalyst solution for 30 min, rinsed with DI water, and immersed in an EL nickel-boron plating bath (NIPOSIT™ 468, Shipley Co., 10% strength) for 20 min at room temperature. A homogeneous metal deposit was produced over the surface of the substrate.

As a control experiment, a UTF-24 film was similarly treated with the PD1 catalyst and the Ni bath. No metallization was observed. This example demonstrates that a ligand-bearing surfaces produced by a Cs grafting reaction is amenable to EL metallization using the PD1 catalyst.

Example 15

Homogeneous EL metallization of a pyridyl ligand surface using Li grafting chemistry The pyridine-based ligating film produced in Example 11 was catalyzed with PD1 and immersed in an EL Ni plating bath solution as described in Example 14. A homogeneous Ni deposit was produced over the surface of the substrate. This example demonstrates the generality of the approach for using grafting reactions to produce ligating surfaces that are amenable to EL metallization.

Example 16

Homogeneous EL metallization of a 4,4'-bipyridyl grafted ligating surface

A UTF-24I film on a fused silica slide, prepared as in Example 4, was treated with a solution of 30 mg of 4,4'-bipyridine in 30 ml of CH$_3$CN for 22 h at 20° C. The UV spectrum of the treated slide exhibited a peak maximum at ≈195 nm, with shoulders at 220 nm and 265 nm. The slide was then catalyzed with PD1 and immersed in an EL Ni plating bath solution as described in Example 14. A homogeneous metal deposit was produced over the surface of the substrate. This example is another illustration of the generality of the approach for using grafting reactions to produce ligating surfaces that are amenable to EL metallization.

Example 17

Homogeneous EL metallization of a thiol grafted ligating surface

A UTF-24I film on a thermal oxide Si wafer, prepared as in Example 4, was treated with a 0.10M solution of Na$_2$S$_2$O$_3$ in 20% ethanol/water for 70 min at 70° C. The wafer was rinsed with water and dried under N$_2$. The water contact angle of the surface was 20°. Hydrolysis of the film with 2.0M H$_2$SO$_4$ at 20° C. resulted in conversion to a thiol surface within 12 h. The film was then catalyzed with PD1 and immersed in an EL Ni plating bath solution as described in Example 14. A homogeneous metal deposit was produced over the surface of the substrate. This example is another illustration of the generality of the approach for using grafting reactions to produce ligating surfaces that are amenable to EL metallization.

Example 18

Patterned selective EL metallization of a UTF-24 surface with Cs grafting chemistry A thermal oxide silicon substrate was treated with UTF-24 as described in Example 1. The substrate was placed in mechanical contact with a chrome-on-quartz lithographic mask that had arrays of serpentine test structures with features to 10 µm linewidth. The film was then exposed through the mask to 2.4 J/cm$^2$ of radiation from a deep UV contact aligner (Hg/Xe lamp with ≈4 mW/cm$^2$ output between 220–300 nm). The patterned surface was treated with cesium nicotinate solution as in Example 10, followed by PD1 catalyst and EL Ni metallization bath as in Example 14. The wafer was removed from the plating bath, rinsed with DI water and dried under a stream of filtered N$_2$. The wafer exhibited Ni metal patterns with feature sizes to 10 µm in the unexposed regions of the surface, resulting in a positive tone image. This example demonstrates that patterned ligand-grafted films can be selectively metallized.

Example 19

Patterned selective EL metallization of a UTF-24I surface with Cs grafting chemistry A native oxide silicon wafer was treated with UTF-24I as described in Example 4. The substrate was placed in mechanical contact with a chrome-on-quartz lithographic mask that had arrays of serpentine test structures with features to 10 µm linewidth. The film was then exposed through the mask to 2.4 J/cm$^2$ of radiation from a deep UV contact aligner as described in Example 18. The patterned surface was treated with cesium nicotinate solution (Example 10) followed by PD1 catalyst and nickel-boron EL metallization bath (Example 14). The wafer exhibited Ni metal patterns with feature sizes to 10 µm in the unexposed regions of the surface, resulting in a positive tone image. This example demonstrates the generality of the grafting approach for patterned selective EL metallization.

Example 20

Patterned selective EL metallization of a UTF-24I surface using diphos grafting chemistry A native oxide silicon wafer was treated with UTF-24I as described in Example 4. The film-covered substrate was exposed through a lithographic step coverage mask (having alternating lines and spaces with resolution to ≈10 µm) to 1 J/cm² of 193 nm radiation from an ArF laser at an energy density of ≈3 mJ/cm² per pulse. The irradiated surface was treated with 6×10⁻⁵M solution of diphos for 96 h, then rinsed in toluene. The surface was then catalyzed and metallized with EL Ni as described in Example 14. The wafer exhibited Ni metal patterns with feature sizes to 10 µm in the unexposed regions of the surface, resulting in a positive tone image. This example further demonstrates the generality of the ligand grafting approach for selective metallization.

Example 21

Patterned selective EL metallization of a UTF-24I surface using lithium grafting chemistry A native oxide silicon wafer was treated with UTF-24I as described in Example 4. The film-covered substrate was exposed to patterned 193 nm radiation as described in Example 20. The irradiated surface was treated with a solution of Li-EDA as described in Example 7. The EDA-treated surface was then catalyzed and metallized with EL Ni as described in Example 14. The wafer exhibited Ni metal patterns with feature sizes to 10 µm in the unexposed regions of the surface, resulting in a positive tone image. This example further demonstrates the generality of the ligand grafting approach for selective metallization.

Example 22

High photospeed, patterned metallization with ligand grafting

A thermal oxide Si wafer, treated with UTF-24 was exposed to patterned radiation from an ArF excimer laser (193 nm) using a high resolution lithographic mask. The mask, which had line/space pair features to 0.5 µm linewidths, was placed in mechanical contact with the film coated wafer. The film was exposed to 50 mJ/cm², and then the wafer was treated as in Example 21. The wafer exhibited patterns of Ni lines and spaces with features to 0.5 µm. This example demonstrates that high resolution metal patterns can be selectively deposited with sub-100 mJ/cm² photospeeds using the UTF grafting chemistry.

Example 23

Electron beam induced exposure of UTF-24 and UTF-24I

Thermal oxide Si wafers were coated with films of UTF-24 and UTF-24I as described in Examples 1 and 3. A low voltage (≈1 eV) charge compensation electron beam was directed at the samples and they were analyzed by XPS for surface composition immediately and then after a fixed period of time. For UTF-24, Cl was completely removed within 90 min. For UTF-24I, I was completely removed in <4 hours. This example demonstrates that halogen removal (and therefore selective patterning and metallization) may be effected by exposure to low energy electrons, as well as by irradiation with light.

Obviously, many modifications and variations of the present invention are possible in light of the above teachings. It is therefore to be understood that, within the scope of the appended claims, the invention may be practiced otherwise than as specifically described.

What is claimed is:

1. A process for modifying a substrate, comprising the steps of:
    a) providing a substrate having benzyl halide or benzyl pseudohalide groups on at least a portion of the substrate, and
    b) contacting the benzyl halide or benzyl pseudohalide functionalized substrate with a nucleophilic reagent with the general formula N-R, wherein N is a nucleophilic group and R is a group capable of imparting to the substrate a selected functionality,
wherein, prior to said step of contacting said substrate with said nucleophilic reagent, at least a portion of said substrate is exposed to sufficient actinic radiation to liberate a selected amount of halide or pseudohalide from said benzyl halide or said benzyl pseudohalide groups, to modify the reactivity of said substrate to said nucleophilic reagent, wherein said amount of actinic radiation is not more than about 100 mJ/cm².

2. The process of claim 1, wherein said actinic radiation is visible light, ultraviolet light, X-rays, γ-rays, electron beams, or ion beams.

3. The process of claim 1, wherein the dose of said actinic radiation is less than a dose of actinic radiation sufficient to convert essentially all of said benzyl halide or benzyl pseudohalide groups on said surface to their photoproducts.

4. The process of claim 1, wherein said actinic radiation is patterned.

5. A process for modifying a substrate, comprising the steps of:
    a) providing a substrate having benzyl halide or benzyl pseudohalide groups on at least a portion of the substrate, and
    b) contacting the benzyl halide or benzyl pseudohalide functionalized substrate with a nucleophilic reagent with the general formula N-R, wherein N is a nucleophilic group and R is a group capable of imparting to the substrate a selected functionality, wherein said functional group R comprises a ligating moiety that is capable of binding an electroless metallization catalyst,
    c) contacting the ligand-modified substrate with an electroless metallization catalyst, and
    d) contacting the catalyzed substrate with an electroless metallization plating solution, whereby a metal film is deposited on the substrate,
wherein, prior to said step of contacting said substrate with said nucleophilic reagent, at least a portion of said substrate is exposed to sufficient actinic radiation to liberate a selected amount of halide or pseudohalide from said benzyl halide or said benzyl pseudohalide groups, to modify the reactivity of said substrate to said nucleophilic reagent, wherein said amount of actinic radiation is not more than about 100 mJ/cm².

6. The process of claim 5, wherein said actinic radiation is visible light, ultraviolet light, X-rays, γ-rays, electron beams, or ion beams.

7. The process of claim 5, wherein said actinic radiation is patterned.

* * * * *